United States Patent [19]
Kao et al.

[11] Patent Number: 5,561,777
[45] Date of Patent: Oct. 1, 1996

[54] PROCESS FOR SEQUENTIALLY READING A PAGE FROM AN IMAGE MEMORY IN EITHER OF TWO DIRECTIONS

[75] Inventors: Jean-Swey Kao, Cerritos; Jack C. Liu, Rancho Palos Verdes; Ronald E. Rider, Menlo Park, all of Calif.

[73] Assignee: Xerox Corporation, Stamford, Conn.

[21] Appl. No.: 114,552

[22] Filed: Aug. 30, 1993

[51] Int. Cl.⁶ .......................... G06F 12/00; G06F 13/00; G11C 8/00; G11C 7/00
[52] U.S. Cl. .......................... 395/405; 395/166; 395/484; 345/190; 345/200; 365/230.04; 365/238.5
[58] Field of Search .................................... 395/481, 484, 395/115, 116, 164, 166, 405; 365/230.03, 230.04, 238.5; 345/200, 190

[56] References Cited

U.S. PATENT DOCUMENTS

| | | | |
|---|---|---|---|
| 4,247,920 | 1/1981 | Springer et al. | 365/230.04 |
| 4,561,072 | 12/1985 | Arakawa et al. | 365/230.03 |
| 4,740,927 | 4/1988 | Baker et al. | 345/200 |
| 4,893,257 | 1/1990 | Dominguez, Jr. et al. | 395/116 |
| 4,926,386 | 5/1990 | Park | 365/230.03 |
| 5,052,046 | 9/1991 | Fukuda et al. | 382/308 |
| 5,361,339 | 11/1994 | Kadakia et al. | 395/421.01 |

Primary Examiner—Glenn Gossage
Attorney, Agent, or Firm—Robert Cunha

[57] ABSTRACT

A process of loading an image in the form of a bit map into a memory which can transfer data words in burst mode in either row or column direction. First, the memory is divided into two sections with odd words stored in one section, even in the other, which allows ping pong buffers to be reading one word from memory while the next is being accessed. Also, the page height is set to be an odd number of words. Therefore, when the entire page is read in or out, successive words in either the row or column direction will always be alternately odd and even. If a partial image is read into the memory, this odd and even relationship will also hold. If an image with an even number of rows is read in, in order to preserve the sequential odd-even sequence, in every other column of the original data successive words are swapped so that the word order becomes 1, 0, 3, 2, etc. Then the addresses are also generated in staggered order, so that the words go into the correct location in memory. In this way, the word order of loading and reading of data is always successively odd and even regardless of the size of the image.

2 Claims, 6 Drawing Sheets

5,561,777

PROCESS FOR SEQUENTIALLY READING A PAGE FROM AN IMAGE MEMORY IN EITHER OF TWO DIRECTIONS

BACKGROUND OF THE INVENTION

A memory circuit for enabling the high speed transfer of data along either rows or columns from a page buffer to a printer, the page buffer having an odd number of locations and the buffer having two buffer registers, odd and even, to allow data transfer to proceed at burst mode rates in both directions.

In a typical printing system, images are loaded either from an input scanner or from a character generator to a page buffer which builds up a page bit map. When the bit map is complete, the image is sent out, one line at a time, to the printer. At high printing rates, the speed at which this transfer can take place from the page buffer to the printer becomes a potentially limiting factor. What is required is a circuit that will accomplish this transfer at high speed.

SUMMARY OF THE INVENTION

This circuit arranges the image page buffer in the memory so that the image buffer can be accessed at maximum speed in both slow scan and fast scan directions. The page buffer uses an odd number of locations for the page height and applies data swapping to bytes of partial images with even height.

This invention accomplishes the objective by, first, providing two buffer registers between the page buffer and the printer, one for transferring words in odd page buffer locations, and one for transferring words in even locations. In this system, one register is being loaded while the other is being read out, thus doubling the speed of the circuit.

A problem with this arrangement is that if the rows are read out, instead of the columns, the words will either be all odd or all even, depending on the row number, and the odd-even buffer system will not work at its rated speed. To remedy this defect, this two-buffer register system is used in combination with a memory that has an odd number of memory locations per column. To use a specific numerical example, in the prior art a page height may be 1,000 bytes. In this invention, the page height would either be 999 or 1,001 bytes. The result is that, if the memory is sequentially loaded, as is the typical case, not only are sequential words in any column alternately odd and even, but sequential words in any row are also alternately odd and even. The result of this is that, when reading out either rows or columns of data, the odd-even buffer registers will operate at rated speed.

One additional problem is encountered with this system and must be remedied. If a partial image, such as a text character, contains an even number of words per column and is loaded separately into the memory, the last word of one column and the first word of the next column will both be either odd or even. The remedy is to, first, switch the bytes in every other column so that the odd and even data bytes are reversed, and second, switch the state of the least significant bit of the address for alternate lines while the image is being loaded into memory. Thus, if the first column was read out from the character generator as words 1, 2, 3 and 4, then the second column will be read out 2, 1, 4, 3. Then, when loading this data into the memory, the address locations are also switched, so that the data goes into the normal location, but the odd-even sequence will be preserved. On the other hand, odd words present no problem so they will be loaded normally. In this way, partial images of either odd or even height will have their odd and even bytes in a checkerboard pattern. Thus, using normal addressing for partial images having an odd number of words per column, and using addressing where the least significant bit is reversed for words having an even number of words per column results in rated speed in all cases when the entire page is read out.

DETAILED DESCRIPTION OF THE INVENTION

Figure 1:
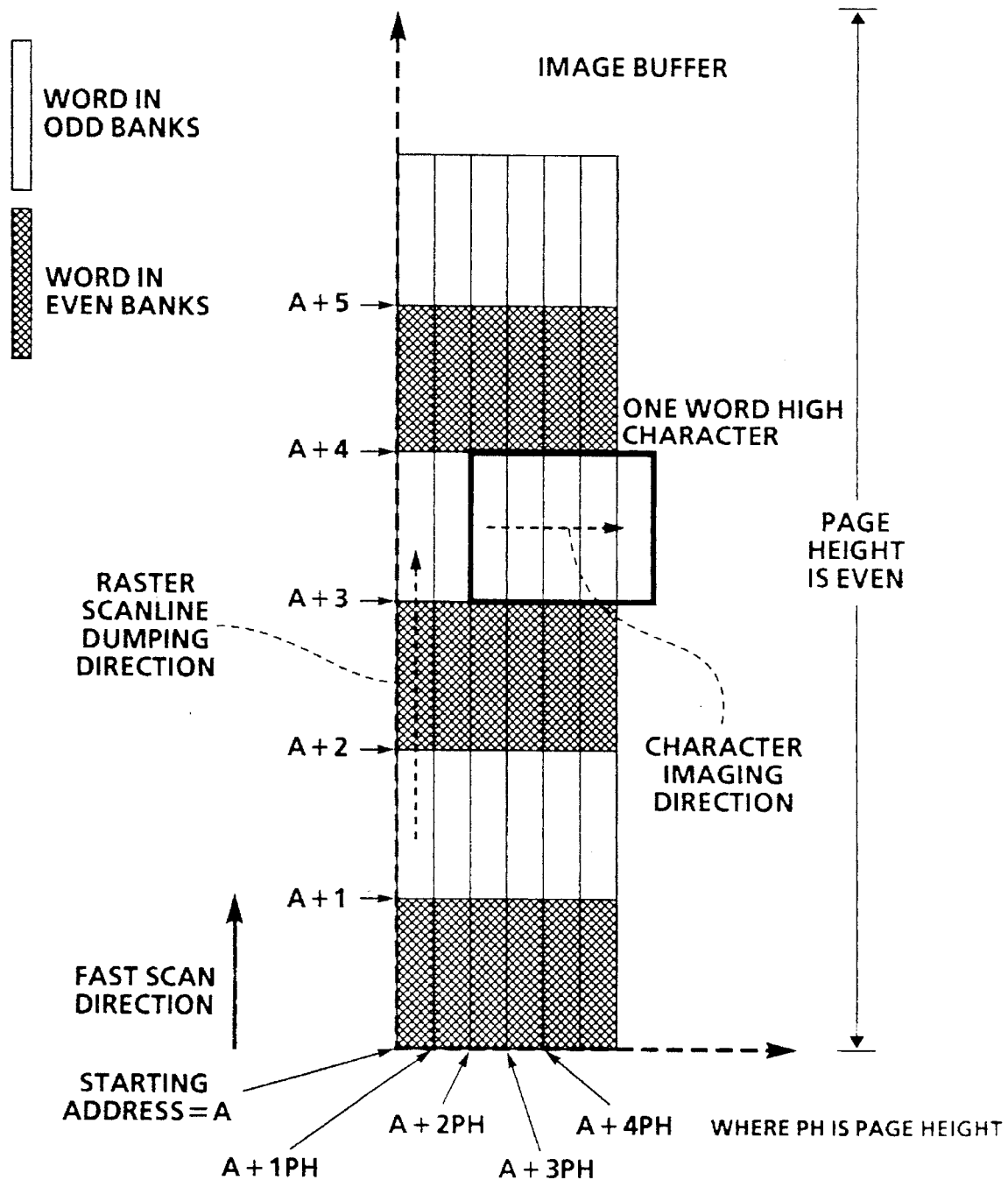
FIG. 1 is a prior art diagram of the readout of a page of even height showing that characters can not be read out along a row in burst mode if the words were read in along columns.

Page buffers are usually implemented from DRAM when a large buffer is required. FIG. 1 shows a typical prior art system having an even number of locations in each image column. If consecutive accesses are in the same row of the DRAM, that is, if the row address does not change, then the access can utilize the fast page mode, or static column mode, to access DRAM memory, resulting in much better throughput than would result from a series of single accesses. Further, the memory can be divided into two banks of memory, an even bank and an odd bank, so that the two memory banks can be accessed in interleaved fast page mode. When one bank precharges, the other bank can be accessed. The interleaved fast page mode of two banks of memory can achieve one data word access per clock cycle maximum throughput.

Figure 2:
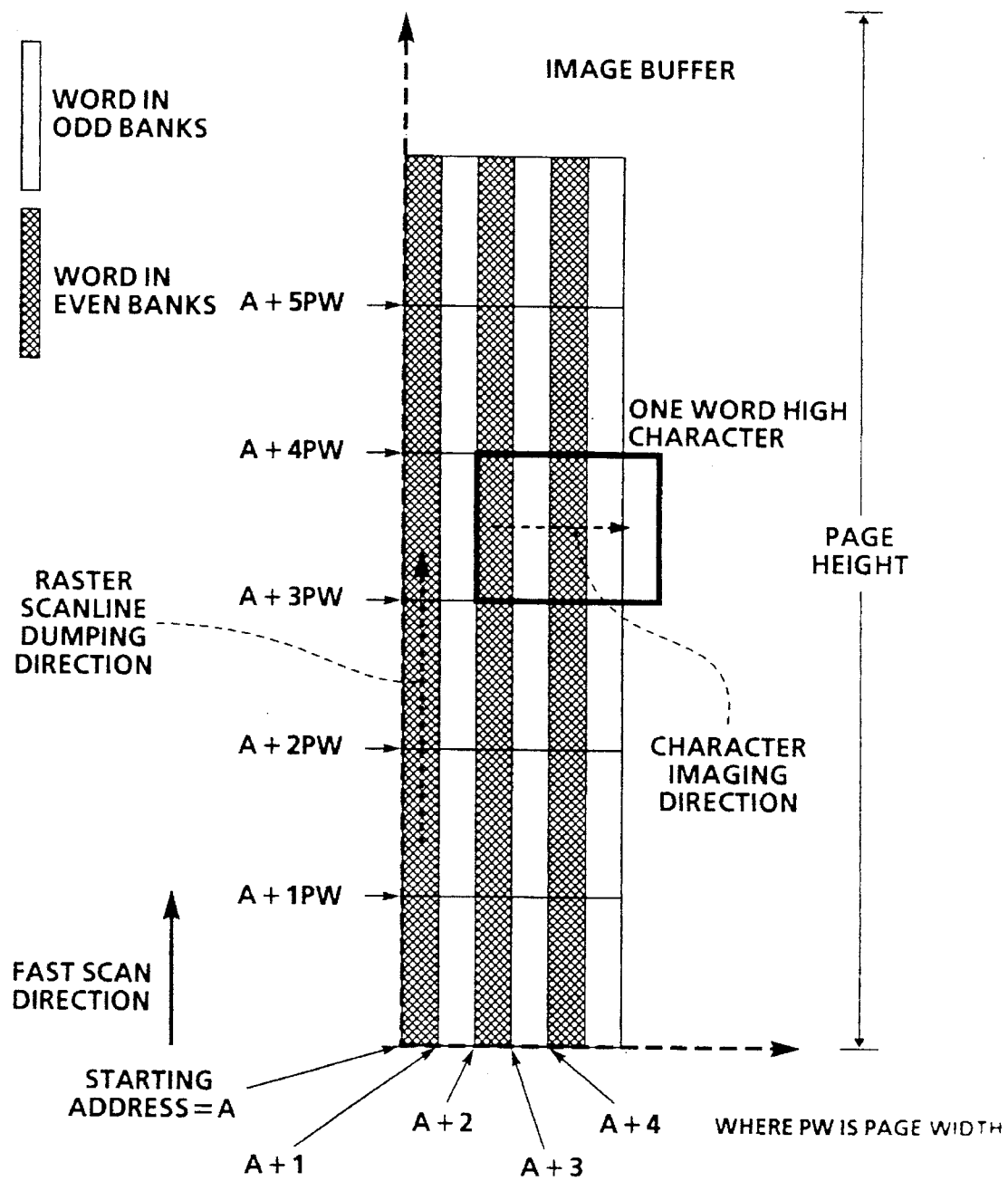
FIG. 2 is a prior art diagram of the readout of a page of even width showing that characters can not be read out along a column in burst mode if the words were read in along rows.

Using interleaved fast page mode with two DRAM memory banks, the image page buffer can be loaded with character image data so that either the bytes alternate between odd and even banks in the vertical direction, as in FIG. 1, or in the horizontal direction, as in FIG. 2. In the first case, an attempt to read along a row will not result in alternate odd and even accesses, and in the second case, an attempt to read along a column will not result in alternate odd and even accesses. In either case, both rows and columns can not be accessed at full speed since, in neither case, do the words alternate between the odd and even memory banks.

When the image data is arranged along the fast scan direction, as in FIG. 1, the addresses of the consecutive data words along the fast scan direction are different by one and the adjacent words along the horizontal direction are different by the page height, which in this case is an even number. The consecutive data in the fast scan direction falls into different banks. In this case, when the data is accessed along the fast scan direction, for example for raster scanline dumping, the maximum throughput can be achieved by alternate accessing of even and odd banks using interleaved fast page mode. However, character imaging usually generates short characters along the slow scan direction (perpendicular to the fast scan direction). One word high characters, for example, would be loaded into only one bank, and therefore can not be interleaved, and the performance of the circuit degrades by half.

When the image buffer is arranged along the slow scan direction, as in FIG. 2, the addresses of the consecutive data along the slow scan direction are different by one and the adjacent word along the fast scan direction is different by the page width. In this case, the access for short characters is efficient along the slow scan direction but the access along the fast scan direction becomes a bottleneck.

Figure 3:
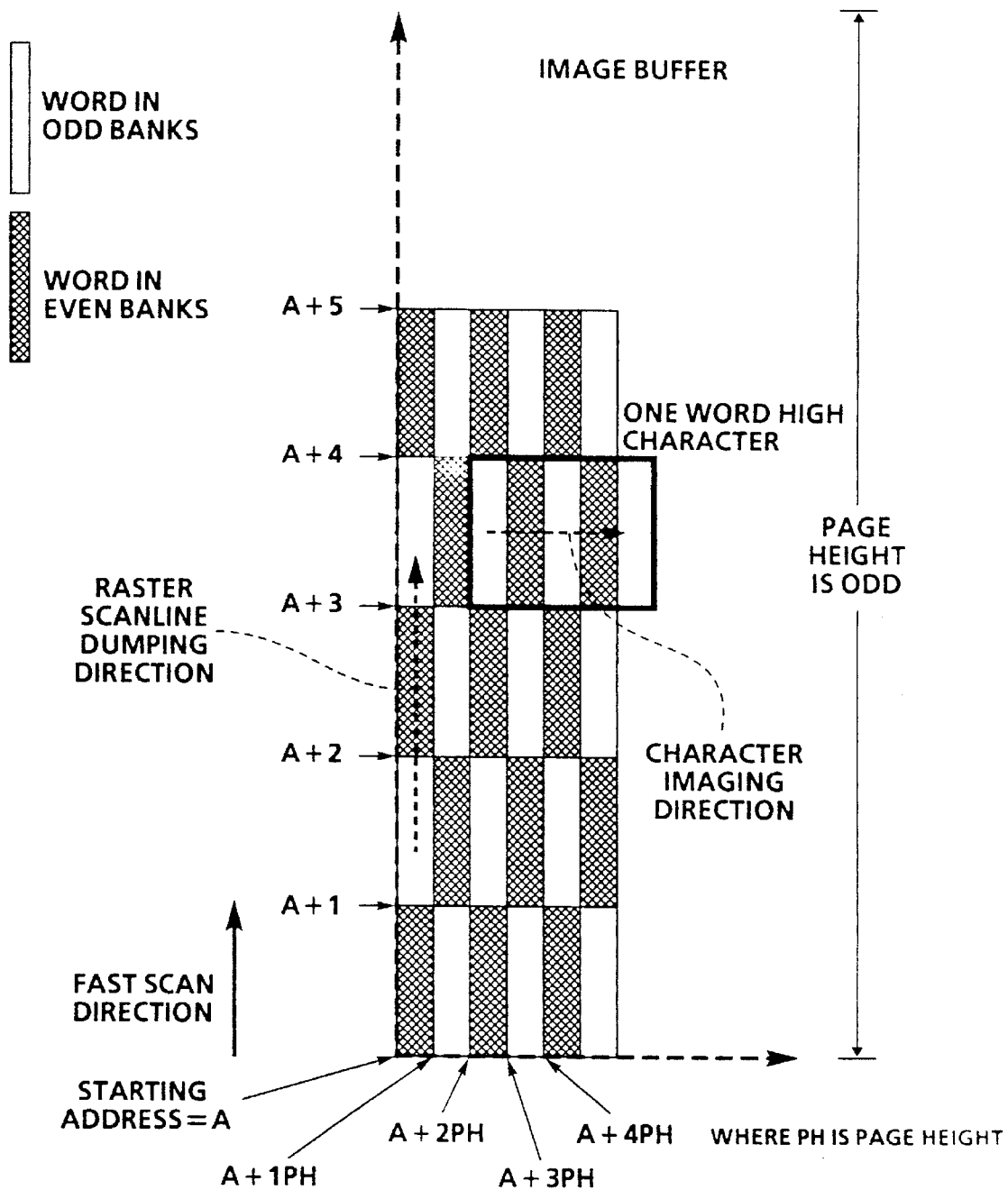
FIG. 3 is a diagram showing the checkerboard pattern where images can be read out along columns or rows in burst mode.

The invention, as shown in FIG. 3, is to configure the odd and even words in the image buffer in a checkerboard pattern so that consecutive data words of the page are in different banks, both vertically and horizontally. The memory system is configured along the fast scan direction so that the address of the consecutive data along the fast scan direction is different by one. However, by setting an odd number for the page height, adjacent locations in the slow scan direction are also in different banks. In this case, the accesses along the fast and slow scan directions can both be interleaved in fast page mode to achieve maximum speed.

FIG. 3 appears to show that when data is read out from a single column, successive words are coming from different rows, and that therefore the memory should not be operating in the page mode. However, in fact, successive words in the image column are most often located in the same row of the device. That is, the device row is so long that several image rows are typically stored in each device row. Therefore, many rows can be read out before an idle cycle is necessary. In the described embodiment, this will happen once for every ten horizontal lines. Therefore, in a four byte high image, for example, this would work out to one idle cycle for every forty lines.

For odd word high character imaging, the sequence of the imaging words alternates between the two banks even at the transition between the top word in one column and the lowest word in the next column. Using a numerical example, if the character height is 5 bytes, as shown in FIG. 3, a checkerboard pattern would result if the character image were read in sequentially. However, for even word heights, the sequence of the loading of bytes would result in alternative odd and even bytes within a scanline, but all bytes in the same row would be the same. Using a numerical example, if the character height is 6 bytes, as shown in FIG. 1, a checkerboard would not result if the character image were read in sequentially. A character as short as two words has this disruption of alternate accesses on every other access.

Address swapping is designed to improve performance in this special situation when the character height is an even number of words, and the memory height is an odd number of words.

Figure 4:
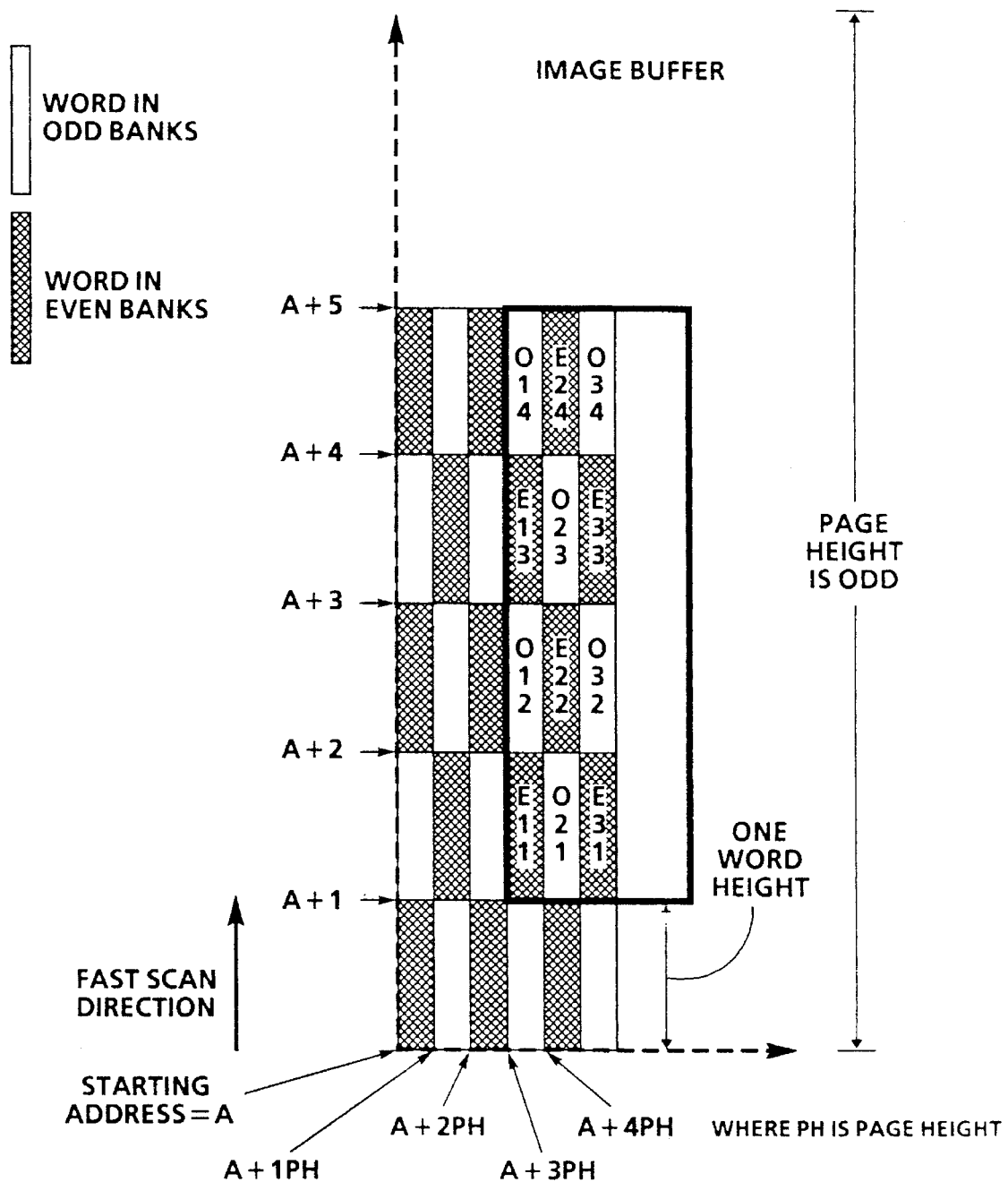
FIG. 4 is a diagram describing data swapping.
Figure 7:
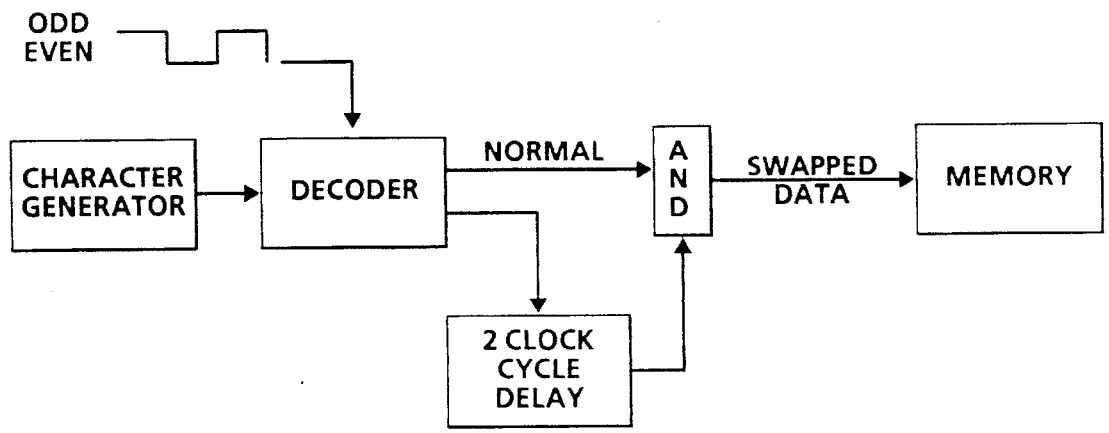
FIG. 7 is a block diagram of a circuit for swapping data between a character generator and the memory.
Figure 8:
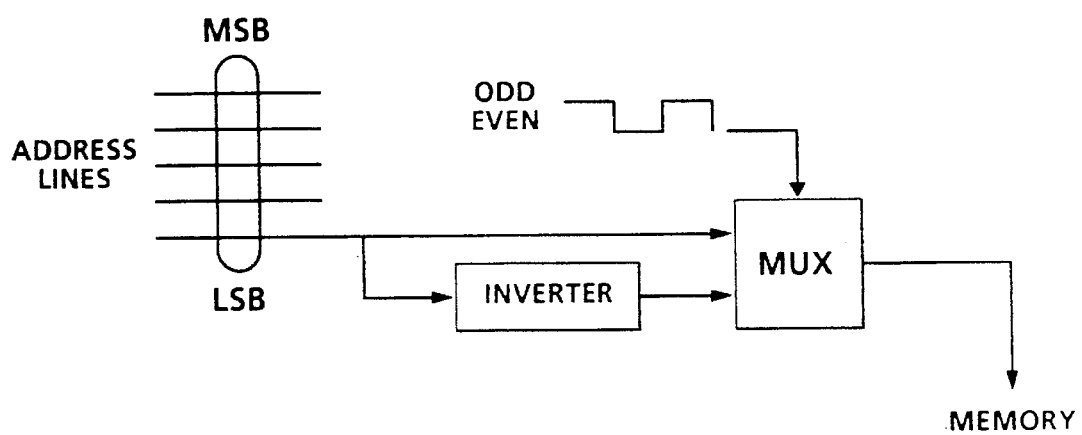
FIG. 8 is a block diagram of a circuit for swapping the least significant bit of the address lines during the loading of data into memory.

First, the bytes in every other column read out from the character generator are swapped. Again, to use an example, if the odd bytes in a swapped line of data are sent directly to the memory, and the even bytes are delayed two clock cycles, then the data will arrive at the memory in swapped order. FIG. 7 is a block diagram of a circuit for using this process to transfer data between a character generator and the memory. Next, as shown in FIG. 8, to load this data into the memory, the addressing sequences of each two consecutive accesses on the odd number of scanlines, (1st, 3rd, . . . etc) are swapped to achieve continuous alternate accesses to even and odd memory banks. For example, the access sequence of a 4 word high character, see FIG. 4, without address swapping is:

E11, O12, E13, O14, Idle, O21, E22, O23, E24, Idle, E31, O32, .

There is an idle cycle between the last data of one scanline and the first word of the next because both are in the same bank. If address swapping is applied, the access sequence is:

Idle, O12, E11, O14, E13, O21, E22, O23, E24, O32, E31, O34, E33, . . .

After address swapping, there is no consecutive access to the same bank, and no wasted cycles at the scanline boundary.

Figure 5:
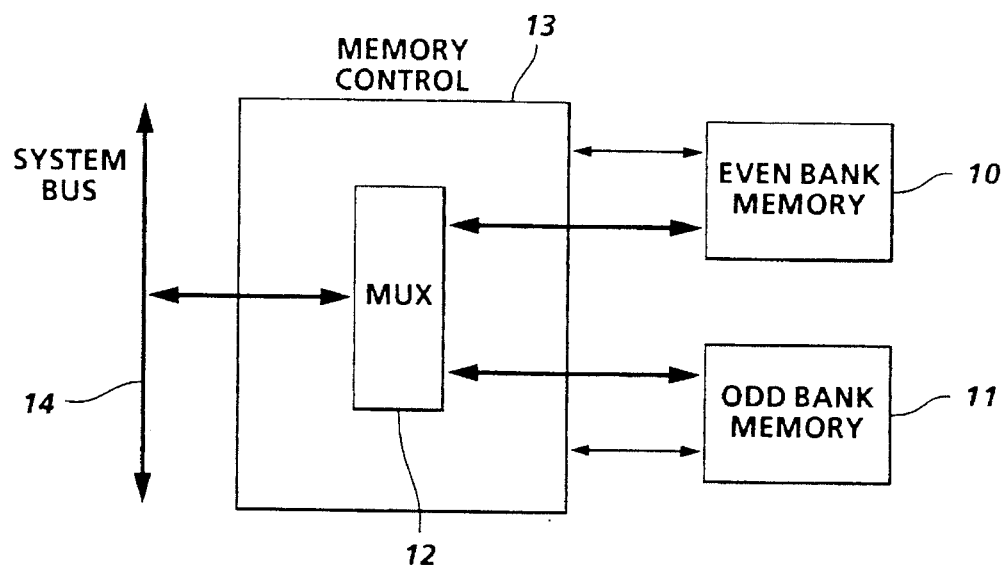
FIG. 5 is a block diagram of a system including a page buffer memory in which this invention may be used.

FIG. 5 is a block diagram of a system including a page buffer memory divided into even and odd portions which can be used to implement this invention. The page buffer memory is divided into two halves, the even bank 10 and the odd bank 11. The memory control 13 sends address and strobe data to the memory banks alternately, and the words output from the two banks are multiplexed by a multiplexer 12 onto a single line and output onto the system bus 14 to the raster output scanner. Similarly, character images from the character generator are transferred over the system bus 14 through the memory control to the odd and even banks 10, 11.

Figure 6:
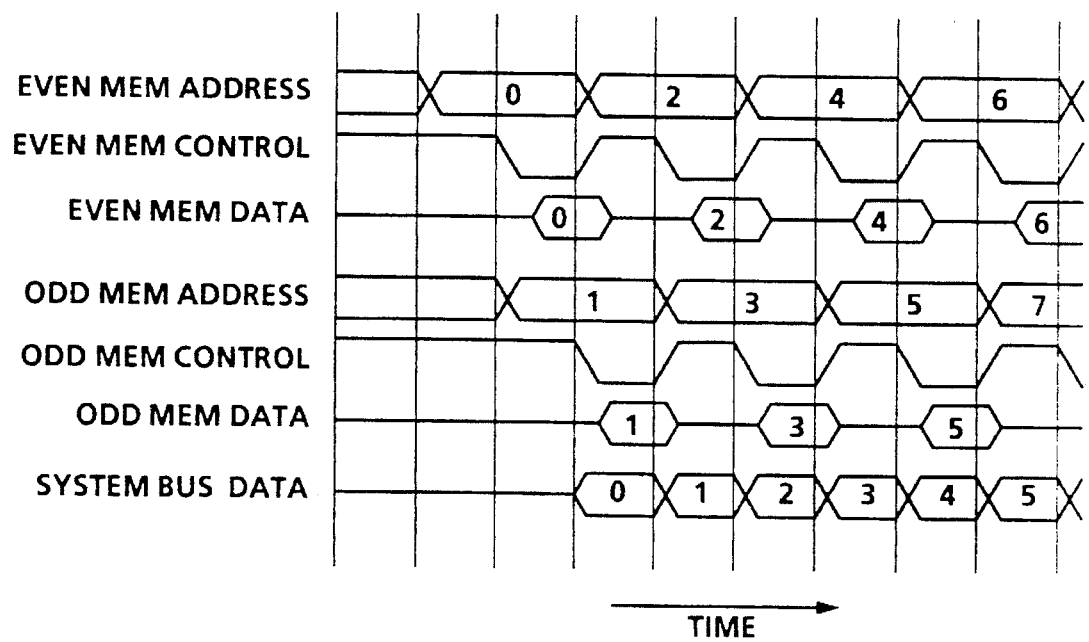
FIG. 6 is a timing diagram for the circuit of FIG. 5.

The control signals for this circuit are shown in FIG. 6. In the page mode, the even memory (column) address must be held for two clock cycles, and the even memory control signal (column address strobe or CAS) occurs mainly during the second half of the address cycle. The output occurs slightly delayed from the strobe. Output words 0, 2, 4 and 6 are shown. The row address line and row address strobe (RAS) are not shown here since it is assumed that the page mode is being used, which implies that the row address is kept constant.

The odd control signals are identical except that they are interleaved with the even control signals, so that the alternate odd output words are output in the dead time between even word outputs. The system multiplexer 12 combines the two data streams to form the system bus data.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

We claim:

1. A process of loading a rectangular image, in the form of a bit map and comprising a series of words, into a memory, said image having rows and columns, a column being defined as a series of words in either direction, and of reading a page out from said memory, said page comprising said rectangular image, said image having an even number of words in each column, said process comprising the steps of:

allocating an odd number of memory locations for each column of the page in memory, changing the sequence of said series of words of said image, the words in one column being in sequence, the words in the next adjacent column being in a sequence that results when the state of the least significant bit of each address of the words in the one column, in binary notation, is reversed, before loading the series of words into said memory, loading this changed sequence of words into said memory, the words of said one column being loaded into sequential locations, the words of said next adjacent column being loaded into locations that would result if the state of the least significant bit of each successive address was reversed, and sequentially reading out from said memory the entire page by row or column.

2. The process of claim 1 further comprising the step of dividing the memory into two sections, a first section for storing words having odd addresses and a second section for storing words having even addresses so that one section can be transferring a word while the other section is receiving an address.

* * * * *